United States Patent
Ishizuka et al.

(10) Patent No.: US 11,670,455 B2
(45) Date of Patent: Jun. 6, 2023

(54) DOUBLE-SIDED COPPER-CLAD LAMINATE

(71) Applicant: MITSUI MINING & SMELTING CO., LTD., Tokyo (JP)

(72) Inventors: Ryuji Ishizuka, Ageo (JP); Yoshihiro Yoneda, Ageo (JP); Toshihiro Hosoi, Ageo (JP); Yuji Kageyama, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 17/770,411

(22) PCT Filed: Jun. 4, 2021

(86) PCT No.: PCT/JP2021/021359
§ 371 (c)(1),
(2) Date: Apr. 20, 2022

(87) PCT Pub. No.: WO2021/251288
PCT Pub. Date: Dec. 16, 2021

(65) Prior Publication Data
US 2022/0351906 A1    Nov. 3, 2022

(30) Foreign Application Priority Data
Jun. 11, 2020 (JP) .............................. JP2020-101923

(51) Int. Cl.
H01G 4/14 (2006.01)
H01G 4/35 (2006.01)
B32B 7/12 (2006.01)
B32B 15/08 (2006.01)
B32B 15/20 (2006.01)
H01G 4/008 (2006.01)

(52) U.S. Cl.
CPC ................ *H01G 4/14* (2013.01); *B32B 7/12* (2013.01); *B32B 15/08* (2013.01); *B32B 15/20* (2013.01); *H01G 4/008* (2013.01); *B32B 2250/03* (2013.01); *B32B 2250/40* (2013.01); *B32B 2307/204* (2013.01); *B32B 2307/732* (2013.01); *B32B 2457/16* (2013.01); *H01G 4/35* (2013.01)

(58) Field of Classification Search
None
See application file for complete search history.

(56) References Cited

U.S. PATENT DOCUMENTS

| | | | |
|---|---|---|---|
| 6,274,224 B1 | 8/2001 | O'Bryan et al. | |
| 6,905,757 B2 | 6/2005 | Matsushima et al. | |
| 2004/0163842 A1 | 8/2004 | Okada et al. | |
| 2007/0223097 A1* | 9/2007 | Garware | B32B 7/12 |
| | | | 359/586 |
| 2019/0184682 A1* | 6/2019 | Hirai | B32B 15/09 |
| 2021/0360785 A1 | 11/2021 | Miyamoto et al. | |

FOREIGN PATENT DOCUMENTS

| | | |
|---|---|---|
| EP | 1 422 055 B1 | 1/2013 |
| JP | 3770537 B2 | 4/2006 |
| JP | 4148501 B2 | 9/2008 |
| JP | 504818 B2 | 10/2012 |
| JP | 2013-124359 A | 6/2013 |
| JP | 6367687 B2 | 7/2018 |
| JP | 6597927 B1 | 10/2019 |
| WO | WO 03/096776 A1 | 11/2003 |
| WO | WO 2015/033917 A1 | 3/2015 |
| WO | WO 2019/208525 A1 | 10/2019 |

OTHER PUBLICATIONS

ISR for PCT/JP2021/021359, dated Aug. 3, 2021.
Written Opinion for PCT/JP2021/021359, dated Aug. 3, 2021 (w/ translation).

* cited by examiner

*Primary Examiner* — Sheeba Ahmed
(74) *Attorney, Agent, or Firm* — Greenblum & Bernstein, P.L.C.

(57) ABSTRACT

There is provided a double-sided copper-clad laminate for forming a capacitor that can exhibit excellent properties in voltage endurance and peel strength, while ensuring high capacitor capacity, when used as a capacitor. This double-sided copper-clad laminate includes an adhesive layer and a copper foil in order on each of both surfaces of a resin film, the resin film is in a cured state at 25° C., and each of the copper foils has a maximum peak height Sp of 0.05 μm or more and 3.3 μm or less as measured in accordance with ISO 25178 on a surface on a side being in contact with the adhesive layer.

11 Claims, 1 Drawing Sheet

DOUBLE-SIDED COPPER-CLAD LAMINATE

TECHNICAL FIELD

The present invention relates to a double-sided copper-clad laminate.

BACKGROUND ART

Printed wiring boards are widely used in electronic communication equipment such as portable electronic equipment. Particularly with the weight and size reduction and high functionalization of portable electronic communication equipment and the like in recent years, reduction of noise in printed wiring boards, and the like have been a challenge. In order to allow noise reduction, a capacitor is important, and in order to achieve performance enhancement, for a capacitor, miniaturization and thinning to the extent that it is incorporated into an inner layer of a printed wiring board are desired. In order to form such a capacitor, a double-sided copper-clad laminate is used. The double-sided copper-clad laminate generally has a configuration in which both surfaces of a resin layer that functions as a dielectric layer are sandwiched between copper foils, and more suitable selection of these components is important for the high functionalization of a capacitor.

For example, Patent Literature 1 (JP5048181B) discloses a passive electrical article in which a pattern can be formed in order to make an electrical circuit. This passive electrical article is a passive electrical article including (a) a first self-supporting substrate having two facing major surfaces, (b) a second self-supporting substrate having two facing major surfaces, and (c) a polymer and including an electrically insulating layer or an electrically conductive layer having a thickness in the range of approximately 0.5 to approximately 10 µm between the first and second substrates. And there is disclosed a passive electrical article characterized in that the RMS average surface roughness of the major surface of the first substrate being in contact with these layers and the major surface of the second substrate being in contact with the layers is in the range of approximately 10 to approximately 300 nm, all of z, a distance upward or downward from the substrate surface, used for measuring the RMS average does not exceed half the thickness of the electrically insulating layer or the electrically conductive layer, and the force needed to separate the first and second substrates of the passive electrical article at a peel angle of 90° exceeds approximately 3 pounds/inch (approximately 0.5 kN/m).

Patent Literature 2 (JP4148501B) discloses a dielectric filler-containing resin composition composed of a binder resin and a dielectric filler. The binder resin is composed of 20 to 80 parts by weight of an epoxy resin (including a curing agent), 20 to 80 parts by weight of an aromatic polyamide resin polymer soluble in organic solvents, and a curing accelerator added in an appropriate amount as needed. The dielectric filler is a generally spherically shaped dielectric powder having a perovskite structure that is composed of any one or more of $BaTiO_3$, $SrTiO_3$, $Pb(Zr—Ti)O_3$, $PbLaTiO_3$—$PbLaZrO$, and $SrBi_2Ta_2O_9$, has an average particle diameter DIA of 0.1 to 1.0 µm, has a weight cumulative particle diameter D50 of 0.2 to 2.0 µm as measured by a laser diffraction scattering type particle size distribution measurement method, and has a value of degree of aggregation of 4.5 or less as represented by D50/DIA using the weight cumulative particle diameter D50, and the average particle diameter DIA obtained by image analysis.

Patent Literature 3 (JP3770537B) discloses a capacitor to be housed in an inner layer portion of a multilayer printed wiring board that is formed of a double-sided copper-clad laminate including a layer configuration in which copper foil layers being electrical conductors are disposed as outer layers on both surfaces, and a resin layer being a dielectric is sandwiched between the copper foil layer on one surface side and the copper foil layer on the other surface side. The resin layer includes a three-layer structure in which its layer configuration is described as thermosetting resin layer/heat-resistant film layer/thermosetting resin layer, and has a total thickness of 25 µm or less. The capacitor is characterized by being formed from a double-sided copper-clad laminate in which the thermosetting resin layers are composed of an epoxy-based resin material, and the heat-resistant film layer is composed of a resin material being a 0.5 to 12.5 µm thick heat-resistant film having normal state properties of a Young's modulus of 300 kg/mm$^2$ or more, a tensile strength of 20 kg/mm$^2$ or more, and a tensile elongation rate of 5% or more, having a softening temperature higher than the molding temperature of the thermosetting resin constituting the thermosetting resin layers located on both surfaces, and having a relative dielectric constant of 2.5 or more under the measurement condition of 1 MHz in accordance with paragraph 2.5.5.9 of IPC-TM-650.

CITATION LIST

Patent Literature

Patent Literature 1: JP5048181B
Patent Literature 2: JP4148501B
Patent Literature 3: JP3770537B
Patent Literature 4: WO2015/033917A1
Patent Literature 5: WO2003/096776A1

SUMMARY OF INVENTION

Although the resin layer and the copper foils constituting the double-sided copper-clad laminate are studied as described above, further improvements are desired. For example, in the case of a configuration having a heat-resistant film (resin film) in the middle of a dielectric layer as described in Patent Literature 3, when there are large nodules and the like on the surfaces of copper foils, these nodules and the like may penetrate the resin layers being in contact with the resin film from the upper and lower sides. When such nodules and the like on the copper foil surfaces are present on the resin side surfaces of both copper foils constituting a capacitor, it is necessary to satisfy voltage endurance properties with only the insulating properties of the resin film present in the middle of the double-sided copper-clad laminate, and the resin film must be made thicker depending on the level of voltage endurance required. However, the resin film portion does not contain a complex oxide such as a filler and has poorer dielectric properties than the resin layers, and therefore the capacitor capacity unfortunately decreases when the resin film is made thicker. That is, the thickness of the resin film and the capacitor capacity (that is, capacitance) is in a trade-off relationship. Further, ensuring not only capacitance but voltage endurance and peel strength (that is, circuit adhesion) is also desired. From the viewpoint of ensuring circuit adhesion, high roughness copper foils (there are large nodules and the like on the surfaces) are generally desired, but they are not desired from the viewpoint of voltage endurance as described above. In addition to this, it is also necessary to achieve a good bonded state of the copper foils and the resin layers and the resin film, and therefore it is not easy to control the surface shape of the copper foils that satisfies the requirements.

The inventors have now found that by controlling the surface properties of the copper foils of a double-sided copper-clad laminate, the double-sided copper-clad laminate can exhibit excellent properties in voltage endurance and peel strength, while ensuring high capacitor capacity, when used as a capacitor.

Therefore, it is an object of the present invention to provide a double-sided copper-clad laminate that can exhibit excellent properties in voltage endurance and peel strength, while ensuring high capacitor capacity, when used as a capacitor.

According to an aspect of the present invention, there is provided a double-sided copper-clad laminate comprising an adhesive layer and a copper foil in order on each of both surfaces of a resin film,
wherein the resin film is in a cured state at 25° C., and
wherein each of the copper foils has a maximum peak height Sp of 0.05 µm or more and 3.3 µm or less as measured in accordance with ISO 25178 on a surface on a side being in contact with the adhesive layer.

According to another aspect of the present invention, there is provided a double-sided copper-clad laminate comprising an adhesive layer and a copper foil in order on each of both surfaces of a resin film,
wherein the resin film is in a cured state at 25° C., and
wherein each of the copper foils has a root mean square gradient Sdq of 0.01 or more and 2.3 or less as measured in accordance with ISO 25178 on a surface on a side being in contact with the adhesive layer.

DESCRIPTION OF EMBODIMENTS

Definitions

Figure 1:
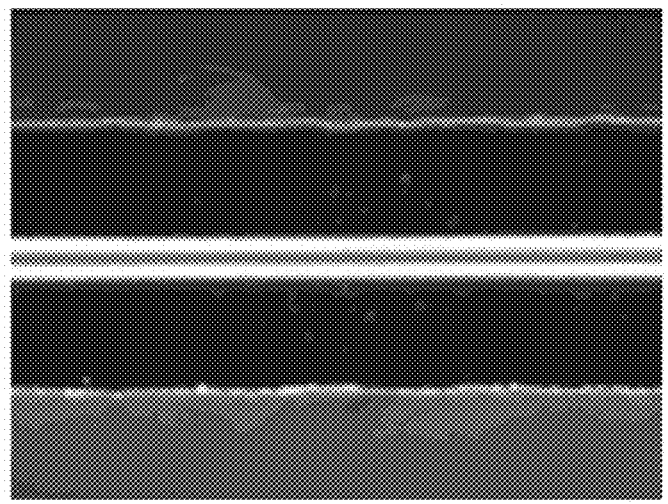
FIG. 1 is a dark field cross-sectional observation image showing a cross section cut in the thickness direction of a double-sided copper-clad laminate obtained in example 4.

The definitions of parameters used for specifying the present invention are shown below.

The "maximum peak height Sp" herein is a three-dimensional parameter that represents the maximum value of height from the average plane of a surface, measured in accordance with ISO 25178.

The "root mean square gradient Sdq" herein is a parameter calculated by the root mean square of slopes at all points in a defined region, measured in accordance with ISO 25178. That is, the "root mean square gradient Sdq" is a three-dimensional parameter for evaluating the magnitude of local slope angles, and therefore the steepness of irregularities on a surface can be quantified. For example, the Sdq of a completely flat surface is 0, and when there are slopes on a surface, Sdq increases. The Sdq of a plane composed of slope components of 45 degrees is 1.

The "kurtosis Sku" herein is a parameter that represents the sharpness of height distribution, measured in accordance with ISO 25178, and is also referred to as peakedness. Sku=3 means that the height distribution is a normal distribution. Sku>3 means that there are many sharp peaks and valleys on the surface. Sku<3 means that the surface is flat.

Double-Sided Copper-Clad Laminate

The double-sided copper-clad laminate of the present invention includes an adhesive layer and a copper foil in order on each of both surfaces of a resin film. The resin film is in a cured state at 25° C. Each of the copper foils has a maximum peak height Sp of 0.05 µm or more and 3.3 µm or less as measured in accordance with ISO 25178 or a root mean square gradient Sdq of 0.01 or more and 2.3 or less as measured in accordance with ISO 25178 on the surface on the side being in contact with the adhesive layer. By controlling the Sp or Sdq of the surface of each copper foil on the side being in contact with the adhesive layer, that is, controlling the surface properties of the copper foils, in this manner, the double-sided copper-clad laminate of the present invention can exhibit excellent properties in voltage endurance and peel strength, while ensuring high capacitor capacity, when used as a capacitor.

As described above, in the case of a configuration in which a double-sided copper-clad laminate has a resin film in the middle of a dielectric layer, when there are large nodules and the like on the surfaces of the copper foils, these nodules and the like may penetrate the resin layers being in contact with the resin film from the upper and lower sides. In that case, the resin film must be made thicker depending on the level of voltage endurance required, but the capacitor capacity unfortunately decreases when the resin film is made thicker. Furthermore, ensuring voltage endurance and peel strength is also desired. In this respect, according to the double-sided copper-clad laminate of the present invention, these problems are conveniently solved.

In the double-sided copper-clad laminate, the peel strength between the copper foil and the resin film measured in accordance with IPC-TM650-2.4.6.0 is preferably 0.5 kgf/cm or more and 4.0 kgf/cm or less, more preferably 0.6 kgf/cm or more and 3.5 kgf/cm or less, and further preferably 0.6 kgf/cm or more and 3.0 kgf/cm or less.

Each of the copper foils that the double-sided copper-clad laminate of the present invention includes has a maximum peak height Sp of 0.05 µm or more and 3.3 µm or less as measured in accordance with ISO 25178 on the surface on the side being in contact with the adhesive layer. This maximum peak height Sp is preferably 0.06 µm or more and 3.1 µm or less, more preferably 0.06 µm or more and 3.0 µm or less, and further preferably 0.07 µm or more and 2.9 µm or less. From the viewpoint of obtaining a particularly thin double-sided laminate, the maximum peak height Sp is even more preferably 2.5 µm or less, still more preferably 1.7 µm or less, and most preferably 1.1 µm or less. By controlling the surface properties of the copper foils in this manner, a double-sided copper-clad laminate is more effectively obtained that can exhibit excellent properties in voltage endurance and peel strength, while ensuring high capacitor capacity, when used as a capacitor. Especially for peel strength, performance to withstand practical use can also be obtained in smooth regions where it has been conventionally considered that sufficient adhesion is not obtained.

In another aspect of the present invention, each of the copper foils that the double-sided copper-clad laminate includes has a root mean square gradient Sdq of 0.01 or more and 2.3 or less as measured in accordance with ISO 25178 on the surface on the side being in contact with the adhesive layer. This root mean square gradient Sdq is preferably 0.02 or more and 2.2 or less, more preferably 0.03 or more and 2.0 or less, and further preferably 0.04 or more and 1.8 or less. From the viewpoint of obtaining a particularly thin double-sided laminate, the root mean square gradient Sdq is even more preferably 1.6 or less, still more preferably 1.3 or less, and most preferably 0.4 or less. By controlling the surface properties of the copper foils in this manner, a double-sided copper-clad laminate is more effectively obtained that can exhibit excellent properties in voltage endurance and peel strength, while ensuring high capacitor capacity, when used as a capacitor. Especially for peel strength, performance to withstand practical use can also be obtained in smooth regions where it has been conventionally considered that sufficient adhesion is not obtained.

Each of the copper foils preferably has a kurtosis Sku of 2.6 or more and 4.0 or less, more preferably 2.7 or more and 3.8 or less, and further preferably 2.7 or more and 3.7 or less as measured in accordance with ISO 25178 on the surface on the side being in contact with the adhesive layer. By controlling the kurtosis Sku in addition to controlling the maximum peak height Sp and the root mean square gradient Sdq as the surface properties of the copper foils in this manner, the desired double-sided copper-clad laminate is more effectively obtained.

The thickness of the copper foil is not particularly limited but is preferably 0.1 µm or more and 200 µm or less, more preferably 0.5 µm or more and 105 µm or less, and further preferably 1.0 µm or more and 70 µm or less. Thus, it is possible to adopt processes such as a subtractive process, a semi-additive process (SAP), and a modified semi-additive process (MSAP), which are general pattern forming methods for the wiring formation of printed wiring boards.

The combination of the adhesive layers and the resin film that the double-sided copper-clad laminate of the present invention includes preferably has a relative dielectric constant of 2.5 or more and 30 or less, more preferably 3.0 or more and 27 or less, and further preferably 3.5 or more and 25 or less at a frequency of 1 MHz in a cured state. When the relative dielectric constant is within such a range, good capacitor capacity can be more effectively ensured.

The resin film preferably has a relative dielectric constant of 2 or more and 30 or less, more preferably 2.5 or more and 27 or less, and further preferably 3.0 or more and 25 or less at a frequency of 1 MHz in a cured state.

The resin film preferably has a thickness of 0.5 µm or more and 30 µm or less, more preferably 1.0 µm or more and 25 µm or less, and further preferably 1.5 µm or more and 18 µm or less. As described above, when there are large nodules and the like on the surfaces of the copper foils, the resin film sometimes must be made thicker. But the double-sided copper-clad laminate of the present invention includes the copper foils in which the surface properties are controlled, and therefore the resin film can have a thickness within the range. That is, both the thickness of the resin film and capacitor capacity can be achieved in an ideal balance.

The resin film preferably includes at least one selected from the group consisting of epoxy resins, polyethylene terephthalate, polyethylene naphthalate, polyvinylcarbazole, polyphenylene sulfide, polyimides, polyamides, aromatic polyamides (for example, wholly aromatic polyamides), polyamide-imides, polyethersulfone, polyethernitrile, polyetheretherketone, and polytetrafluoroethylene, more preferably at least one selected from the group consisting of epoxy resins, polyphenylene sulfide, polyimides, polyamides, polyamide-imides, and wholly aromatic polyamides (aramids), and further preferably at least one selected from the group consisting of epoxy resins, polyimides, polyamides, and wholly aromatic polyamides (aramids). Examples of those commercially available as such a resin film include para-aramid films and polyimide films.

The resin film is preferably subjected to surface roughening treatment. Examples of the method of surface roughening treatment include plasma treatment, corona discharge treatment, and sandblast treatment. By subjecting the resin film to such surface roughening treatment, the areas of the contact interfaces between the resin film and the adhesive layers can be increased to improve the adhesion (peel strength) to avoid delamination. Examples of more preferred surface roughening treatment for the resin film include plasma treatment and corona discharge treatment.

The adhesive layers that the double-sided copper-clad laminate of the present invention includes preferably have a relative dielectric constant of 2.5 or more and 30 or less, more preferably 3.0 or more and 28.0 or less, and further preferably 4.0 or more and 26 or less at a frequency of 1 MHz in a cured state.

The adhesive layers are preferably composed of a resin composition including a resin component and a dielectric filler. This resin component is composed of a thermoplastic component and/or a thermosetting component. Specifically, the resin component preferably includes at least one selected from the group consisting of epoxy resins, polyethylene terephthalate resins, polyethylene naphthalate resins, polyvinylcarbazole resins, polyphenylene sulfide resins, polyamide resins, aromatic polyamide resins, polyamide-imide resins, polyimide resins, polyethersulfone resins, polyethernitrile resins, polyetheretherketone resins, polytetrafluoroethylene resins, urethane resins, isocyanate resins, active ester resins, phenolic resins, and diamine compounds, more preferably at least one selected from the group consisting of epoxy resins, polyimide resins, aromatic polyamide resins, active ester resins, phenolic resins, and diamine compounds.

The adhesive layers preferably further include a dielectric filler being a complex metal oxide containing at least two selected from the group consisting of Ba, Ti, Sr, Pb, Zr, La, Ta, Ca, and Bi. This complex metal oxide more preferably contains at least two selected from the group consisting of Ba, Ti, and Sr. Thus, a double-sided copper-clad laminate that provides good capacitor capacity is more effectively obtained.

The complex metal oxide preferably includes at least one selected from the group consisting of $BaTiO_3$, $SrTiO_3$, $Pb(Zr,Ti)O_3$, $PbLaTiO_3$, $PbLaZrO$, and $SrBi_2Ta_2O_9$, more preferably at least one selected from the group consisting of $BaTiO_3$ and $SrTiO_3$. $Pb(Zr,Ti)O_3$ means $Pb(Zr_xTi_{1-x})O_3$, wherein $0 \leq x \leq 1$, typically $0 < x < 1$. Thus, a double-sided copper-clad laminate that provides good capacitor capacity is more effectively obtained.

The dielectric filler being the complex metal oxide is preferably used. When a dielectric filler is used, the dielectric filler is preferably included in an amount of 0 parts by weight or more and 90 parts by weight or less, more preferably 15 parts by weight or more and 85 parts by weight or less, and further preferably 25 parts by weight or more and 80 parts by weight or less based on 100 parts by weight of the solids of the resin composition.

The particle diameter of the dielectric filler being the complex metal oxide is not particularly limited, but from the viewpoint of maintaining the adhesion between the adhesive layers and the copper foils, the average particle diameter $D_{50}$ measured by laser diffraction scattering type particle size distribution measurement is preferably 0.001 µm or more and 2.0 µm or less, more preferably 0.01 µm or more and 1.8 µm or less, and further preferably 0.03 µm or more and 1.6 µm or less.

The resin composition may further include a filler dispersing agent. By further including the filler dispersing agent, the dispersibility of the dielectric filler can be improved when a resin varnish and the dielectric filler are kneaded. For the filler dispersing agent, a known one that can be used can be appropriately used, and is not particularly limited. Examples of preferred filler dispersing agents include phosphonic acid type, cationic, carboxylic acid type, and anionic dispersing agents, which are ionic dispersing agents, and other dispersing agents such as ether type, ester type, sorbitan ester type, diester type, monoglyceride type, ethylene oxide addition type, ethylenediamine base type, and phenol type dispersing agents, which are nonionic dispersing agents. Other examples include coupling agents such as silane coupling agents, titanate coupling agents, and aluminate coupling agents.

A curing accelerator may be added to the resin composition in order to promote the curing of the resin component. Preferred examples of the curing accelerator include imidazole-based curing accelerators and amine-based curing accelerators. The content of the curing accelerator is preferably 0.01 parts by weight or more and 3.0 parts by weight or less, more preferably 0.1 parts by weight or more and 2.0 parts by weight or less, based on 100 parts by weight of the nonvolatile components in the resin composition, from the viewpoint of the storage stability of the resin component included in the resin composition and the efficiency of the curing.

The double-sided copper-clad laminate of the present invention is typically obtained by coating copper foils with a resin composition to form adhesive layers, using a gravure coating method, so that the thickness of each adhesive layer after drying is a predetermined value, and drying the resin composition. The method of this coating is arbitrary, and a gravure coating method or other methods such as a die coating method or a knife coating method can be adopted. In addition, a doctor blade, a bar coater, or the like can also be used for coating.

EXAMPLES

The present invention will be more specifically described by the following examples.

Examples 1 to 9

(1) Preparation of Resin Varnish
First, as raw material components for a resin varnish, the resin components and the imidazole-based curing accelerator shown below were provided.
Biphenyl-aralkyl type epoxy resin: manufactured by Nippon Kayaku Co., Ltd., NC-3000
Polyfunctional phenolic resin (curing agent): manufactured by Meiwa Plastic Industries, Ltd., MEH-7500
Phenolic hydroxyl group-containing polybutadiene-modified aromatic polyamide resin: manufactured by Nippon Kayaku Co., Ltd., BPAM-155
Imidazole-based epoxy resin curing accelerator: manufactured by SHIKOKU CHEMICALS CORPORATION, 2P4 MHZ The raw material components for a resin varnish were weighed in a blending ratio (weight ratio) shown in Tables 1A and 1B. Then, a cyclopentanone solvent was weighed, and the raw material components for a resin varnish and the cyclopentanone solvent were charged into a flask and stirred at 60° C. After it was confirmed that there were no undissolved residues of the raw materials in the resin varnish, and that the resin varnish was transparent, the resin varnish was collected.

(2) Kneading with Filler
Then, the dielectric filler and the dispersing agent shown below were provided.
Barium titanate: manufactured by Nippon Chemical Industrial Co., Ltd.
Titanate-based coupling agent: manufactured by Ajinomoto Fine-Techno Co., Inc., KR-44 (1.5 parts by weight as an amount added based on 100 parts by weight of the dielectric filler)

A cyclopentanone solvent, the dielectric filler, and the dispersing agent were each weighed. The weighed solvent, dielectric filler, and dispersing agent were slurried by a dispersing machine. After this slurrying was confirmed, the resin varnish was weighed so that the blending ratio (weight ratio) of the final dielectric filler was as shown in Tables 1A and 1B, and kneaded with the dielectric filler-containing slurry by the dispersing machine. After the kneading, it was confirmed that the dielectric filler did not aggregate. Thus, a coating liquid including a resin composition constituting adhesive layers was obtained.

(3) Provision of Copper Foil
As a copper foil to be coated with the coating liquid, a roughening-treated copper foil was provided. The manufacture of this copper foil was performed by a known method as disclosed in Patent Literature 4, Patent Literature 5, or the like.

(4) Resin Coating
The copper foil described in the above (3) was coated with the coating liquid obtained in the above (2), using a bar coater, so that the thickness of the adhesive layer after drying was as shown in Tables 1A and 1B, and then dried in an oven heated to 130° C. for 3 minutes to bring the resin into a semi-cured state. Thus, an adhesive layer-attached copper foil was obtained.

(5) Provision of Resin Films
The resin films shown below were provided.
Aramid film: manufactured by Teijin Advanced Films Limited, Aramica
Polyimide film: manufactured by KANEKA CORPORATION, Apical These resin films were subjected to surface roughening treatment. Specifically, Aramica was subjected to corona discharge treatment, and Apical was subjected to plasma treatment.

(6) Pressing
In examples 1 to 5, an adhesive layer-attached copper foil was placed with its coating resin surface facing upward, and a resin film was superposed on the coating resin surface. Further, an adhesive layer-attached copper foil having its coating resin surface down was superposed on the surface of the resin film on the side not being in contact with the coating resin surface. At this time, vacuum pressing was performed at 180° C. for 120 minutes to bring the adhesive layers into a cured state. Thus, a double-sided copper-clad laminate was obtained.

In examples 6 to 9, no resin film was used, and two adhesive layer-attached copper foils were superposed so that their coating resin surfaces faced each other. Vacuum pressing was performed at 180° C. for 120 minutes to bring the adhesive layers into a cured state to obtain a double-sided copper-clad laminate.

(7) Evaluations

For the copper foils and the obtained double-sided copper-clad laminates, the following various evaluations were performed.

<Evaluation 1: Surface Property Parameters of Copper Foil>

The measurement of the roughening-treated surface of the roughening-treated copper foil of the above (3) was performed in accordance with ISO 25178 by surface roughness analysis using a laser microscope (manufactured by Olympus Corporation, OLS5000). Specifically, the surface profile of a region having an area of 16384 μm² on the roughening-treated surface of the roughening-treated copper foil was measured by the laser microscope with a 100× lens having a numerical aperture (N.A.) of 0.95. The surface profile of the roughening-treated surface obtained was subjected to noise removal and linear surface inclination correction, and then the measurement of various parameters, Sp, Sdq, and Sku, was carried out by surface property analysis. Each of these Sp, Sdq, and Sku was measured with the cutoff wavelength of an S filter set at 0.55 μm and the cutoff wavelength of an L filter set at 10 μm. The results were as shown in Tables 1A and 1B.

<Evaluation 2: Capacitance (Cp)>

One surface of a double-sided copper-clad laminate was subjected to etching to fabricate a circular circuit having a diameter of 0.5 inches (12.6 mm), and then the capacitance at a frequency of 1 MHz was measured by an LCR meter (manufactured by HIOKI E.E. CORPORATION, LCR HiT-ESTER 3532-50). This measurement was performed in accordance with IPC-TM-650 2.5.2. The measured capacitance was evaluated according to the following criteria. The results were as shown in Table 2.

Evaluation A: 10.0 nF/in² or more (best)

Evaluation B: 5.0 nF/in² or more and less than 10.0 nF/in² (good)

Evaluation C: 1.0 nF/in² or more and less than 5.0 nF/in² (acceptable)

Evaluation D: less than 1.0 nF/in² (unacceptable)

<Evaluation 3: Breakdown Voltage (BDV)>

One surface of a double-sided copper-clad laminate was subjected to etching to fabricate a circular circuit having a diameter of 0.5 inches (12.6 mm), and then the breakdown voltage under the condition of a voltage increase rate of 167 V/sec was measured by an insulation resistance measuring instrument (manufactured by HIOKI E.E. CORPORATION, super-insulation meter SM7110). This measurement was performed in accordance with IPC-TM-650 2.5.6.2a. The measured breakdown voltage was evaluated according to the following criteria. The results were as shown in Table 2.

Evaluation A: greater than 5000 V (best)

Evaluation B: greater than 3500 V and 5000 V or less (good)

Evaluation C: greater than 2000 V and 3500 V or less (acceptable)

Evaluation D: 2000 V or less (unacceptable)

<Evaluation 4: Breakdown Strength>

The breakdown voltage (BDV) measured in Evaluation 3 was divided by the dielectric layer thickness (the thickness of the resin film having the adhesive layers) to calculate the value.

The calculated breakdown strength was evaluated according to the following criteria. The results were as shown in Table 2

Evaluation A: greater than 220 kV/mm (best)

Evaluation B: greater than 200 kV/mm and 220 kV/mm or less (good)

Evaluation C: greater than 100 kV/mm and 200 kV/mm or less (acceptable)

Evaluation D: 100 kV/mm or less (unacceptable)

<Evaluation 5: Normal State Peel Strength (Circuit adhesion)>

One surface of a double-sided copper-clad laminate was subjected to etching to fabricate a 3 mm wide straight circuit, and then the circuit was peeled at a peel rate of 50 mm/minute by Autograph, and the peel strength was measured at normal temperature (for example, 25° C.). This measurement was performed in accordance with IPC-TM-650 2.4.8. The measured normal state peel strength was evaluated according to the following criteria. The results were as shown in Table 2.

Evaluation A: 1.5 kgf/cm or more (best)

Evaluation B: 1.0 kgf/cm or more and less than 1.5 kgf/cm (good)

Evaluation C: 0.6 kgf/cm or more and less than 1.0 kgf/cm (acceptable)

Evaluation D: less than 0.6 kgf/cm (unacceptable)

<Evaluation 6: Relative Dielectric Constant (Dk)>

The copper on both surfaces of a double-sided copper-clad laminate was all etched away to obtain the resin film having the adhesive layers (the combination of the adhesive layers and the resin film). For this resin film having the adhesive layers, the relative dielectric constant at 1 MHz was measured by using the capacitance (Cp) measured in Evaluation 2 and the formula $Cp = \varepsilon_0 \times Dk \times (S/d)$, wherein $\varepsilon_0$ is the dielectric constant of a vacuum, S is the area of the circular circuit, and d is the thickness of the dielectric layer. The calculated relative dielectric constant was evaluated according to the following criteria. The results were as shown in Table 2.

Evaluation A: the relative dielectric constant at 1 MHz is 6.5 or more

Evaluation B: the relative dielectric constant at 1 MHz is 5.0 or more and less than 6.5

Evaluation C: the relative dielectric constant at 1 MHz is 2.5 or more and less than 5.0

Evaluation D: the relative dielectric constant at 1 MHz is less than 2.5

<Evaluation 7: Bonded State>

Figure 2:
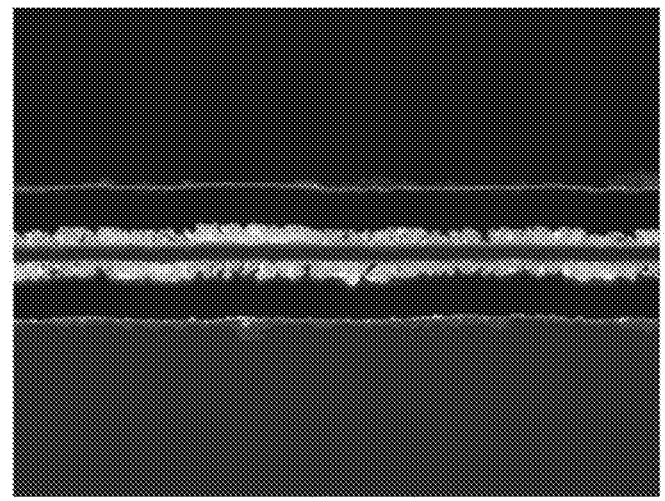
FIG. 2 is a dark field cross-sectional observation image showing a cross section cut in the thickness direction of a double-sided copper-clad laminate obtained in the same manner as example 5 except that the thickness of the copper foil was changed to 12 µm.

A double-sided copper-clad laminate was cut into a size of approximately 8 mm wide and 5 mm long, and then cut in the thickness direction of the double-sided copper-clad laminate using a microtome (Leica Biosystems, RM2265, fully automatic universal rotary microtome) to expose the cross section. The cross section was observed by an optical microscope (Leica Microsystems, Leica DM LM) to confirm whether or not the copper foils and the film were properly bonded by the adhesive layers. Whether the observed bonded state was good or bad was evaluated according to the following criteria. The results were as shown in Table 2. FIG. 1 shows a dark field cross-sectional observation image of a cross section of the double-sided copper-clad laminate obtained in example 4, and FIG. 2 shows a dark field cross-sectional observation image of a cross section of a double-sided copper-clad laminate obtained in the same manner as example 5 except that the thickness of the copper foil was changed to 12 μm.

Good: The adhesive layers are uniformly present between the copper foil surfaces and the resin film.

Poor: The adhesive layers are nonuniform between the copper foil surfaces and the resin film (there are holes in the adhesive layers, or the copper foil surfaces are directly joined to the resin film).

In the Evaluations 2 to 6, in the case of Evaluation C or more, it was determined that performance to withstand practical use was obtained, and in the case of Evaluation B or more, it was determined that excellent properties were exhibited as a capacitor. When the evaluation is poor in Evaluation 7, voids and the like occur inside, and therefore intrinsic capacitor performance cannot be exhibited. Based on such criteria, it is preferred that there are no Evaluations D and the total of Evaluations C is three or less in the results of Evaluation 2 to 6, and that the result of Evaluation 7 is good.

TABLE 1A

| | Component | Blending | Manufacturer and product number | | Ex. 1 | Ex. 2 | Ex. 3 | Ex. 4 |
|---|---|---|---|---|---|---|---|---|
| Resin composition constituting adhesive layers | Biphenyl-aralkyl type epoxy resin | Resin component blending ratio (parts by weight based on 100 parts by weight of total amount of resin components) | Nippon Kayaku | NC-3000 | | | 51 | |
| | Polyfunctional phenolic resin (curing agent) | | Meiwa Plastic Industries | MEH-7500 | | | 18 | |
| | Phenolic hydroxyl group-containing polybutadiene-modified aromatic polyamide resin | | Nippon Kayaku | BPAM-155 | | | 31 | |
| | Imidazole-based epoxy resin curing agent | | SHIKOKU CHEMICALS CORPORATION | 2P4MHZ | | | 0.4 | |
| | Barium titanate | Dielectric filler content (parts by weight based on 100 parts by weight of solids of resin composition) | Nippon Chemical Industrial | | No | No | No | 75 |
| | Adhesive layer | | Thickness of single layer (μm) | | 5.0 | 5.0 | 5.0 | 2.0 |
| | | | Relative dielectric constant Dk @1 MHz | | 4.4 | 4.4 | 4.4 | 23.0 |
| | Film | | Type | | Aramica | Aramica | Apical | Aramica |
| | | | Thickness (μm) | | 12.0 | 12.0 | 12.5 | 4.4 |
| | | | Surface treatment | | Corona treatment | Corona treatment | Plasma treatment | Corona treatment |
| | | | Relative dielectric constant Dk @1 MHz | | 3.7 | 3.7 | 3.2 | 3.7 |
| | Copper foil (Evaluation 1) | | Sp (μm) | | 0.085 | 2.51 | 2.51 | 0.085 |
| | | | Sdq | | 0.053 | 1.63 | 1.63 | 0.053 |
| | | | Sku | | 3.50 | 3.33 | 3.33 | 3.50 |
| | | | Thickness (μm) | | 35 | 35 | 35 | 35 |

TABLE 1B

| | Component | Blending | Manufacturer and product number | | Ex. 5* | Ex. 6* | Ex. 7* | Ex. 8* | Ex. 9* |
|---|---|---|---|---|---|---|---|---|---|
| Resin composition constituting adhesive layers | Biphenyl-aralkyl type epoxy resin | Resin component blending ratio (parts by weight based on 100 parts by weight of total amount of resin components) | Nippon Kayaku | NC-3000 | | | 51 | | |
| | Polyfunctional phenolic resin (curing agent) | | Meiwa Plastic Industries | MEH-7500 | | | 18 | | |
| | Phenolic hydroxyl group-containing polybutadiene-modified aromatic polyamide resin | | Nippon Kayaku | BPAM-155 | | | 31 | | |
| | Imidazole-based epoxy resin curing agent | | SHIKOKU CHEMICALS CORPORATION | 2P4MHZ | | | 0.4 | | |
| | Barium titanate | Dielectric filler content (parts by weight based on 100 parts by weight of solids of resin composition) | Nippon Chemical Industrial | | 75 | No | No | 75 | 75 |
| | Adhesive layer | | Thickness of single layer (μm) | | 2.0 | 22.0 | 22.0 | 8.0 | 8.0 |
| | | | Relative dielectric constant Dk @1 MHz | | 23.0 | 4.4 | 4.4 | 23.0 | 23.0 |
| | Film | | Type | | Aramica | — | — | — | — |
| | | | Thickness (μm) | | 4.4 | — | — | — | — |
| | | | Surface treatment | | Corona treatment | — | — | — | — |
| | | | Relative dielectric constant Dk @1 MHz | | 3.7 | — | — | — | — |

TABLE 1B-continued

| Component | Blending | Manufacturer and product number | Ex. 5* | Ex. 6* | Ex. 7* | Ex. 8* | Ex. 9* |
|---|---|---|---|---|---|---|---|
| Copper foil (Evaluation 1) | | Sp (μm) | 3.59 | 0.085 | 3.59 | 0.085 | 3.59 |
| | | Sdq | 2.39 | 0.053 | 2.39 | 0.053 | 2.39 |
| | | Sku | 2.54 | 3.50 | 2.54 | 3.50 | 2.54 |
| | | Thickness (μm) | 35 | 35 | 35 | 35 | 35 |

*indicates a Comparative Example.

TABLE 2

| | | | Ex. 1 | Ex. 2 | Ex. 3 | Ex. 4 | Ex. 5* | Ex. 6* | Ex. 7* | Ex. 8* | Ex. 9* |
|---|---|---|---|---|---|---|---|---|---|---|---|
| Evaluation results | Evaluation 2 | Capacitance@1 MHz (nF/in$^2$) | 1.2 | 1.2 | 1.0 | 5.5 | 5.5 | 1.4 | 1.4 | 17.8 | 28.0 |
| | | Determination | C | C | C | B | B | C | C | A | A |
| | Evaluation 3 | Breakdown voltage (BDV)(V) | >5000 | >5000 | >5000 | 2600 | 2200 | 4200 | 3500 | 150 | 50 |
| | | Determination | A | A | A | C | C | B | C | D | D |
| | Evaluation 4 | Breakdown strength (kV/mm) | >220 | >220 | >220 | >220 | >220 | 190 | 160 | 20 | 7 |
| | | Determination | A | A | A | A | A | C | C | D | D |
| | Evaluation 5 | Normal state peel strength (kgf/cm) | 0.9 | 1.4 | 1.4 | 0.8 | 0.6 | 0.9 | 1.5 | 0.9 | 0.6 |
| | | Determination | C | B | B | C | C | C | A | C | C |
| | Evaluation 6 | Relative dielectric constant Dk(@1 MHz) | 4.4 | 4.4 | 3.8 | 6.5 | 6.4 | 4.4 | 4.4 | 23.0 | 23.0 |
| | | Determination | C | C | C | A | B | C | C | A | A |
| | Evaluation 7 | Bonded state | Good | Good | Good | Good | Poor | Good | Good | Good | Poor |

*indicates a Comparative Example.

The invention claimed is:

1. A double-sided copper-clad laminate comprising an adhesive layer and a copper foil in order on each of both surfaces of a resin film,
wherein the resin film is in a cured state at 25° C., and
wherein each of the copper foils has a root mean square gradient Sdq of 0.01 or more and 2.3 or less as measured in accordance with ISO 25178 on a surface on a side being in contact with the adhesive layer.

2. The double-sided copper-clad laminate according to claim 1, wherein a combination of the adhesive layers and the resin film has a relative dielectric constant of 2.5 or more and 30 or less at a frequency of 1 MHz in a cured state.

3. The double-sided copper-clad laminate according to claim 1, wherein the resin film has a relative dielectric constant of 2 or more and 30 or less at a frequency of 1 MHz in a cured state.

4. The double-sided copper-clad laminate according to claim 1, wherein the adhesive layers have a relative dielectric constant of 2.5 or more and 30 or less at a frequency of 1 MHz in a cured state.

5. The double-sided copper-clad laminate according to claim 1, wherein the resin film has a thickness of 0.5 μm or more and 30 μm or less.

6. The double-sided copper-clad laminate according to claim 1, wherein the resin film comprises at least one selected from the group consisting of epoxy resins, polyethylene terephthalate, polyethylene naphthalate, polyvinylcarbazole, polyphenylene sulfide, polyimides, polyamides, aromatic polyamides, polyamide-imides, polyethersulfone, polyethernitrile, polyetheretherketone, and polytetrafluoroethylene.

7. The double-sided copper-clad laminate according to claim 1, wherein the adhesive layers comprise a resin component composed of a thermoplastic component and/or a thermosetting component, and the resin component comprises at least one selected from the group consisting of epoxy resins, polyethylene terephthalate resins, polyethylene naphthalate resins, polyvinylcarbazole resins, polyphenylene sulfide resins, polyamide resins, aromatic polyamide resins, polyamide-imide resins, polyimide resins, polyethersulfone resins, polyethernitrile resins, polyetheretherketone resins, polytetrafluoroethylene resins, urethane resins, isocyanate resins, active ester resins, phenolic resins, and diamine compounds.

8. The double-sided copper-clad laminate according to claim 1, wherein the adhesive layers further comprise a dielectric filler being a complex metal oxide containing at least two selected from the group consisting of Ba, Ti, Sr, Pb, Zr, La, Ta, Ca, and Bi.

9. The double-sided copper-clad laminate according to claim 8, wherein the complex metal oxide comprises at least one selected from the group consisting of $BaTiO_3$, $SrTiO_3$, $Pb(Zr,Ti)O_3$, $PbLaTiO_3$, $PbLaZrO$, and $SrBi_2Ta_2O_9$.

10. The double-sided copper-clad laminate according to claim 1, wherein each of the copper foils has a kurtosis Sku of 2.6 or more and 4.0 or less as measured in accordance with ISO 25178 on the surface on the side being in contact with the adhesive layer.

11. The double-sided copper-clad laminate according to claim 1, wherein peel strength between the copper foil and the resin film measured in accordance with IPC-TM650-2.4.6.C is 0.5 kgf/cm or more and 4.0 kgf/cm or less.

* * * * *